: (12) United States Patent
Mizuno et al.

(10) Patent No.: US 7,215,162 B2
(45) Date of Patent: May 8, 2007

(54) START SIGNAL OUTPUTTING CIRCUIT (75) Inventors: Kazuo Mizuno, Aichi (JP); Ryu Kimura, Aichi (JP); Hisanori Uda, Aichi (JP); Hiroaki Hayashi, Aichi (JP)

(73) Assignee: DENSO Corporation, Kariya (JP)

( * ) Notice: Subject to any disclaimer, the term of this patent is extended or adjusted under 35 U.S.C. 154(b) by 66 days.

(21) Appl. No.: 10/523,352

(22) PCT Filed: Sep. 24, 2003

(86) PCT No.: PCT/JP03/12175

§ 371 (c)(1),
(2), (4) Date: Jan. 28, 2005

(87) PCT Pub. No.: WO2004/030205

PCT Pub. Date: Apr. 8, 2004

(65) Prior Publication Data

US 2006/0114035 A1    Jun. 1, 2006

(30) Foreign Application Priority Data

Sep. 25, 2002 (JP) .............................. 2002-279567
Sep. 1, 2003 (JP) .............................. 2002-308263

(51) Int. Cl.
H03D 3/00 (2006.01)
(52) U.S. Cl. ..................................... 327/102; 327/100
(58) Field of Classification Search ............... 327/100, 327/102, 58, 91, 94, 104; 341/122
See application file for complete search history.

(56) References Cited

U.S. PATENT DOCUMENTS 3,681,700 A    8/1972    Rennick ..................... 327/349

(Continued)

FOREIGN PATENT DOCUMENTS

JP    4-291167    10/1992

(Continued)

OTHER PUBLICATIONS

International Search Report for PCT/JP03/12175; ISA/JPO; Dated: Dec. 9, 2003.

*Primary Examiner*—Timothy P. Callahan
*Assistant Examiner*—Hai L. Nguyen
(74) *Attorney, Agent, or Firm*—Harness, Dickey & Pierce, PLC (57) ABSTRACT A start signal outputting circuit according to the invention has a differential RF/DC convertor part 100 for converting a high frequency power (RF) into a d.c. potential (DC). The RF/DC convertor part 100 is formed by two transistors $Q_{RD}$, $Q_{DD}$ working as a diode, and transistors $Q_{R1 \sim R3}$, $Q_{D1 \sim D3}$ and resistances $R_{R1 \sim R3}$ for forming high resistances at anode sides and cathode sides of these diodes, respectively. A differential amplification part 200 disposed at a later stage of the diode has not only amplifying effect but also low-pass filtering effect together with filtering pars 120, 210 of its previous and later stages. In this case, it is designed so that current flowing through the respective circuits is about 2~3 μA. As a result, even if the high frequency power of the specified frequency is weak, for example −60~−40 dBm, a start signal outputting circuit 1000 which outputs a d.c. potential of 0.3~2.4V, is suitable for integration and has a low power consumption can be obtained.

13 Claims, 10 Drawing Sheets

U.S. PATENT DOCUMENTS

| | | | | |
|---|---|---|---|---|
| 4,079,325 A | * | 3/1978 | Mawhinney et al. | 327/102 |
| 4,253,057 A | * | 2/1981 | Carlton et al. | 324/620 |
| 4,496,858 A | * | 1/1985 | Smith | 327/102 |
| 4,706,262 A | | 11/1987 | Ohta | 375/297 |
| 5,119,099 A | | 6/1992 | Haruyama et al. | 342/51 |
| 5,130,571 A | * | 7/1992 | Carroll | 327/94 |
| 5,804,993 A | | 9/1998 | Suzuki | 327/58 |
| 6,011,488 A | * | 1/2000 | Busser | 340/10.34 |
| 6,084,920 A | * | 7/2000 | Ferdinandsen | 375/297 |
| 6,173,160 B1 | * | 1/2001 | Liimatainen | 455/67.11 |
| 6,265,940 B1 | | 7/2001 | Adachi | 330/440 |
| 6,400,205 B1 | * | 6/2002 | Yokota | 327/330 |
| 6,426,676 B1 | | 7/2002 | Kuijk | 330/252 |
| 6,668,162 B1 | * | 12/2003 | Murtojarvi | 455/115.1 |
| 6,841,981 B2 | * | 1/2005 | Smith et al. | 323/312 |
| 6,859,190 B2 | * | 2/2005 | Pillai et al. | 343/860 |

FOREIGN PATENT DOCUMENTS

| | | |
|---|---|---|
| JP | 6-48895 | 6/1994 |
| JP | 6-303036 A | 10/1994 |
| JP | 7-297645 A | 11/1995 |
| JP | 8-139635 A | 5/1996 |
| JP | 2561023 | 9/1996 |
| JP | 2605827 | 2/1997 |
| JP | 09-162944 | 6/1997 |
| JP | 11-355055 A | 12/1999 |
| JP | 2001-68951 A | 3/2001 |

* cited by examiner

FIG. 12

START SIGNAL OUTPUTTING CIRCUIT

TECHNICAL FIELD

This invention relates to a novel start signal outputting circuit. Here a start signal outputting circuit is defined as a circuit for outputting a direct current potential (DC) when inputting a high frequency power (RF) of a certain frequency band. This definition naturally includes circuits which, when inputting a high frequency power (RF) in the respective band intermittently at short intervals, output a direct current potential (DC) intermittently in correspondence with this. An example of a related field of the invention is technology relating to diode wave detection and rectenna.

BACKGROUND ART

As technology relating to diode wave detection and rectenna, technologies disclosed in Japanese Patent No.2561023 (Document 1), Japanese Patent No. 2605827 (Document 2), JP-A-4-291167 (Document 3), JP-A-9-162644 (Document 4), Japanese Patent No. 2533800 (Document 5), and JP-B-6-48895 (Document 6) are known. Of these, Documents 1 through 4 disclose technology relating to high frequency wave detection using a diode, and Documents 5 and 6 disclose technology relating to rectenna.

Figure 11A:
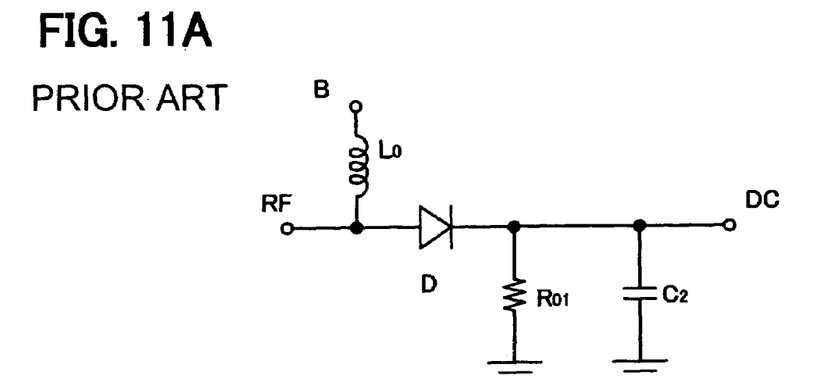

First, high frequency wave detection technology using an ordinary diode disclosed in Documents 1 through 3 will be described. FIG. 11A shows a known diode detection circuit for performing high frequency wave detection. In the diode detection circuit shown in FIG. 11A, a bias voltage source B is connected to the anode side of a diode D via an inductance $L_0$, and a resistance $R_{01}$ and a capacitance $C_2$ connected to ground are connected in parallel with each other to the cathode side of the diode D. However, the diode detection circuit shown in FIG. 11A is sometimes operated without a bias voltage being applied.

For example, when a low-level high frequency power is to be detected, generally, down to about −40 dBm a zero bias Schottky diode or the like can be used. When the high frequency power is of a lower level than that, normally, a slight bias voltage is applied. However, even when a bias voltage is applied, as will be further discussed later about −50 dBm constitutes a lower limit of high frequency wave detection.

To convert high frequency power into direct current, half-wave rectification is used; but when the circuit shown in FIG. 11A is used for that purpose, to convert a low-level high frequency power into a direct current it is necessary for the d.c. bias current to be made very small. For example to realize a bias current of 1 μA with a voltage of 3V, a resistance of 3 MΩ is necessary. In this case, the inductance $L_0$ on the anode side of the diode D of FIG. 11A can be replaced with a resistance $R_{02}$ (FIG. 11B)

Figure 11B:
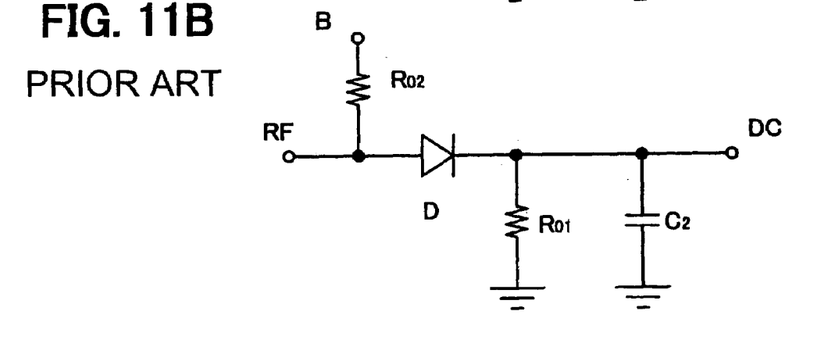

However, in the cases of both FIGS. 11A and 11B, the resistances $R_{01}$ and $R_{02}$ used must be of several MΩ. When a resistance having a large resistance value like this is realized on an IC chip, the resistance element becomes long, and a large space becomes necessary. As a result, the facing area of the resistance element facing ground becomes large, a parasitic capacitance and a parasitic resistance arise between the resistance on the chip and the ground in the substrate, and the high frequency power leaks to the substrate. Consequently, to convert a low-level high frequency power of for example 5.8 GHz, −60 dBm into a direct current with a diode circuit formed on an IC chip is difficult.

Although it is possible to convert a low-level high frequency wave of −60 dBm into a direct current by using heterodyne detection technology, a transmitter or LAN and mixer must be operated continually, and the power consumed during high frequency signal standby time becomes large.

Also, with a high frequency detection circuit using a diode, it is notable that when the load resistance is large, the voltage applied across the anode/cathode of the diode becomes small and the high frequency wave cannot be converted, and that post-conversion output resulting from bias fluctuation is not distinguishable from d.c. potential obtained by converting high frequency power.

In Document 4, technology for producing a d.c. potential corresponding to an inputted high frequency power level is disclosed. That is, in Document 4, technology for converting a high frequency power of essentially any frequency into a d.c. current is disclosed. The technology of Documents 5 and 6 relates to rectenna, and discloses the use of received microwaves as a power source.

The present invention relates to a start signal outputting circuit capable of receiving a high frequency wave, generating a d.c. potential from that high frequency wave, and using this d.c. potential as a starting signal of a designated circuit, and particularly it is an object of the invention to provide a start signal outputting circuit having a construction suitable for integration. It is another object of the invention to provide a start signal outputting circuit capable of generating a low-noise d.c. potential when converting a high frequency signal into a d.c. potential.

DISCLOSURE OF THE INVENTION

A start signal outputting circuit provided by the invention has an RF/DC convertor circuit for converting a high frequency power of a specified frequency into a d.c. component and outputting this. This RF/DC convertor circuit is made up of a device working as a diode; a matching circuit provided on the anode side of that diode for obtaining matching with respect to the inputted high frequency power; a first transistor, connected to the anode side of the diode, working as a high resistance to which a positive potential is applied; and a second transistor, inserted between the cathode side of the diode and ground, working as a high resistance to which a positive potential is applied. Thus, by utilizing the high resistance across the base/emitter of a transistor and the current source arising across the collector/emitter, it becomes possible to realize a high resistance having low high frequency leakage. And because first and second transistors are used as high resistances, a construction suited to integration can be obtained.

The RF/DC convertor circuit also has a resonance circuit connected between the cathode side of the diode and ground for shorting at a specified frequency. By a circuit for shorting at the specified frequency being provided on the cathode side of the diode, the high frequency power can be applied to the diode efficiently.

And, in the RF/DC convert or circuit, a two-stage transistor circuit may be connected to the cathode side of the diode. That is, a first npn transistor having its collector connected to the cathode side of the diode and its emitter connected to ground via a resistance, and a second npn transistor having its emitter connected to the base of the first npn transistor and a predetermined positive voltage applied to its base and collector may be provided. When the transistor on the cathode side of the diode is made two-stage like this and a resistance is provided between it and ground, cathode potential adjustment of the diode becomes easy and further stabilization of the circuit can be achieved.

Using a start signal outputting circuit according to the invention described above, when a specified high frequency wave is received, it is possible to start for example a communication device as a designated device, and to cause a primary battery for the communication device to be consumed when the specified high frequency wave is received. By this means it is possible to realize mobile communication appliances in which a primary battery for a communication device can be used for several years.

Other characteristics and excellent effects of the invention will become clear from the following description of embodiments using drawings.

BRIEF DESCRIPTION OF THE DRAWINGS

FIG. 10 is characteristic charts of the start signal outputting circuit of the fifth embodiment, FIG. 10A being the output characteristic of a first-stage filter part and FIG. 10B the output characteristic of a second-stage filter part. FIG. 11 is circuit diagrams of diode RF/DC convertor circuits of related art, FIG. 11A showing one example and FIG. 11B another example.

BEST MODES FOR CARRYING OUT THE INVENTION

First, characteristics of a start signal outputting circuit according to the invention will be explained directly. Firstly, in an ordinary diode detecting circuit (for example FIG. 11), when currents are to be made low, the resistance values become extremely high, and it becomes unsuitable for integration. The start signal outputting circuit of the present invention uses transistors to realize integration (reduced size) and low currents (low power consumption). Secondly, in connecting an amplifier part for amplifying the d.c. potential (DC), by the amplifier being made low-current a band-limiting effect is provided, and by filtering circuits being provided before and after the amplifier part the band-limiting effect is strengthened. By means of this band-limiting, high sensitivity in the vicinity of the outputted d.c. potential (DC) can be achieved. In this way, both low power consumption and high sensitivity of the amplifier part are obtained.

The 'RF/DC convertor circuit for converting high frequency power of a specified frequency into a d.c. component and outputting it' in the start signal outputting circuit naturally includes 'circuits which, when inputting a high frequency power (RF) in the respective band intermittently at short intervals, output a d.c. current (DC) intermittently in correspondence with this'. And also included are 'circuits which when inputting a high frequency power (RF) in the respective frequency band output a corresponding d.c. potential (DC) (High Level) and when not inputting a high frequency power (RF) in the respective frequency band do not output a d.c. potential (DC) (Low Level)'.

(First Embondiment)

Figure 1:
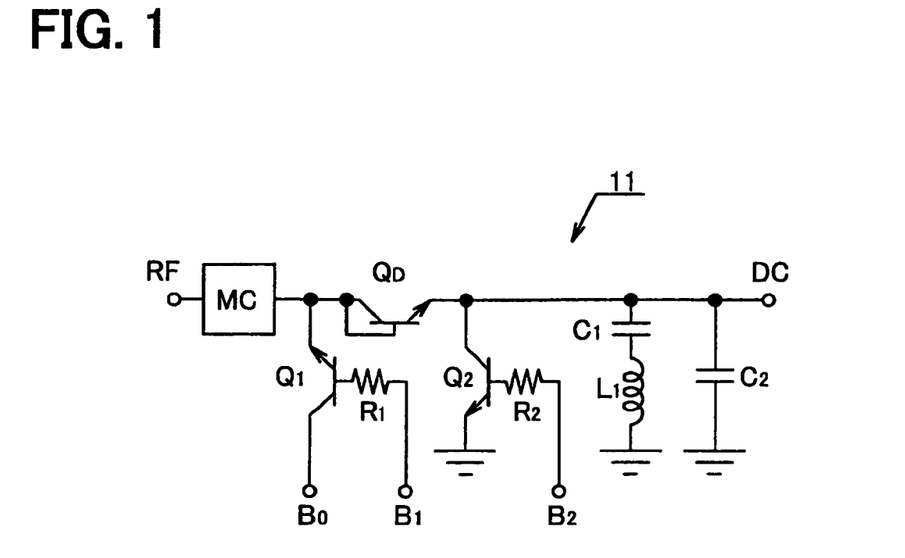
FIG. 1 is a circuit diagram showing an RF/DC convertor circuit constituting a main part of a start signal outputting circuit according to a first embodiment of the invention.

FIG. 1 is a circuit diagram showing an RF/DC-conversion circuit 11 constituting a main part of a start signal outputting circuit according to a first embodiment of the invention. The RF/DC-conversion circuit 11 is made up of a matching circuit MC; an npn transistor $Q_D$ used as a diode; an npn transistor $Q_1$ having its emitter connected to the base (anode side) of the npn transistor $Q_D$; a resistance $R_1$ connected to the base of the npn transistor $Q_1$; an npn transistor $Q_2$ having its collector connected to the emitter (cathode side) of the npn transistor $Q_D$; a resistance $R_2$ connected to the base of the npn transistor $Q_2$; a capacitance $C_1$ and an inductance $L_1$ connected in series with the emitter (cathode side) of the npn transistor $Q_D$; and a capacitance $C_2$ also connected to the emitter (cathode side) of the npn transistor $Q_D$.

A potential $B_0$ is applied to the collector of the npn transistor $Q_1$ and a potential $B_1$ to the base via the resistance $R_1$. The npn transistor $Q_2$ has its emitter grounded and a potential $B_2$ applied to its base via the resistance $R_2$.

One end of the series circuit of the capacitance $C_1$ and the inductance $L_1$ is connected to the emitter of the npn transistor $Q_D$, and the other end is grounded. As a result, this series circuit shorts at a specified signal (carrier). The other end of the capacitance $C_2$ having its first end connected to the emitter of the npn transistor $Q_D$ is also grounded.

The matching circuit MC performs impedance matching of a high frequency signal with respect to the anode end of the npn transistor $Q_D$ using a stub, transmission line, or chip capacitance.

The operation of the RF/DC-conversion circuit 11 of FIG. 1 is as follows. A high frequency wave passes through the matching circuit MC and is applied to the base (anode side) of the npn transistor $Q_D$, which works as a diode. Because impedance matching has been carried out by the matching circuit MC, the high frequency power is applied to the npn transistor $Q_D$ with good efficiency.

The npn transistor $Q_1$ has a high resistance between its base and emitter, and its collector and emitter work as a constant current source. Consequently, the transistor $Q_1$ works as a high resistance on the anode side (base) of the npn transistor $Q_D$. The collector and emitter of the npn transistor $Q_2$ work as a constant current source, and it works as a high resistance on the cathode side (emitter) of the npn transistor $Q_D$. The collector and base of the npn transistor $Q_2$ are joined by a capacitance, but this capacitance is small. Furthermore, high frequency leakage is prevented by the resistance $R_2$.

Because the capacitance $C_1$ and inductance $L_1$ on the cathode side (emitter) of the npn transistor $Q_D$ are grounded and short at a specified carrier, the high frequency power is applied to the npn transistor $Q_D$ efficiently. In this way, a d.c. potential DC of the cathode side (emitter) of the npn transistor $Q_D$ is outputted. This d.c. potential DC maybe put through an amplifier in a later stage or may be used as it is as a signal for starting a communication device or the like constituting a designated output destination. When there is no amplifier in a later stage, the RF/DC-conversion circuit 11 it self constitutes a start signal outputting circuit.

(Second Embodiment)

Figure 2:
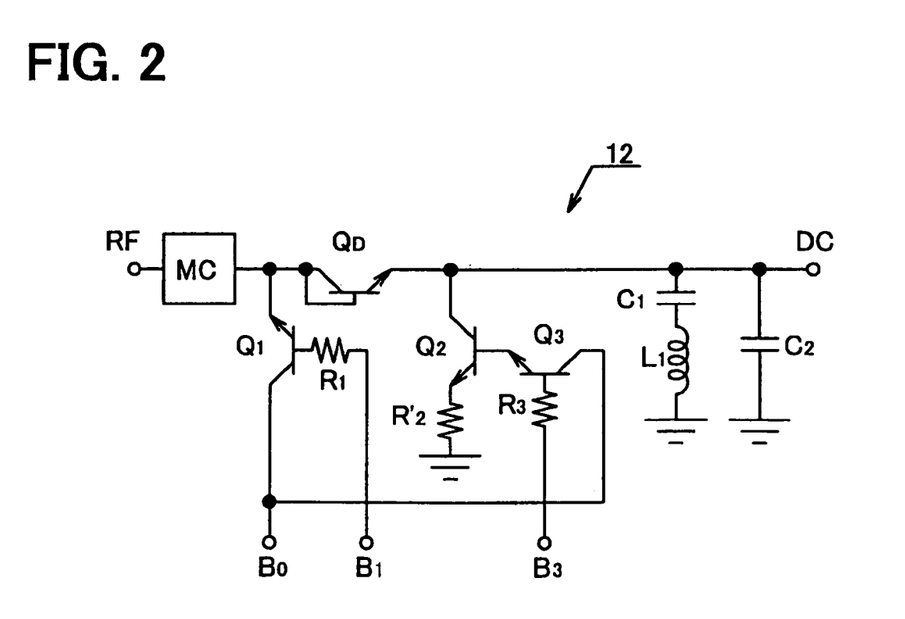
FIG. 2 is a circuit diagram showing an RF/DC convertor circuit constituting a main part of a start signal outputting circuit according to a second embodiment of the invention.

FIG. 2 is a circuit diagram showing an RF/DC-conversion circuit 12 constituting a main part of a start signal outputting circuit according to a second embodiment of the invention. From the construction of the RF/DC-conversion circuit 11 of FIG. 1, the RF/DC-conversion circuit 12 has the resistance $R_2$ connected to the base of the npn transistor $Q_2$ removed along with the bias potential $B_2$. In their place, a resistance $R'_2$ is provided between the emitter of the npn transistor $Q_2$ and ground and the emitter of an npn transistor $Q_3$ is connected to the base of the npn transistor $Q_2$. A bias potential $B_3$ is applied to the base of the npn transistor $Q_3$ via a resistance $R_3$, and the bias potential $B_0$ is applied to the collector of the npn transistor $Q_3$.

The RF/DC-conversion circuit 12 of FIG. 2 was made in view of the fact that it is difficult to freely adjust the potential of the cathode side (emitter) of the npn transistor $Q_D$ which works as the diode of the RF/DC-conversion circuit 11 of FIG. 1. With the RF/DC-conversion circuit 12 shown in FIG. 2, first the potential of the cathode side (emitter) of the npn transistor $Q_3$ working as a diode rises by the voltage drop of the resistance $R'_2$. The resistance $R'_2$ also acts as a feedback resistance preventing fluctuation of the bias potential due to temperature variation. By the npn transistor $Q_3$ being added, the high resistance (the resistance $R_2$) of the RF/DC-conversion circuit 11 of FIG. 1 is formed with the npn transistor $Q_3$. By this means it is possible to increase the controllability of the base potential of the npn transistor $Q_2$ and control its collector current and the bias potential of the cathode side (emitter) of the npn transistor $Q_D$.

Figure 3A:
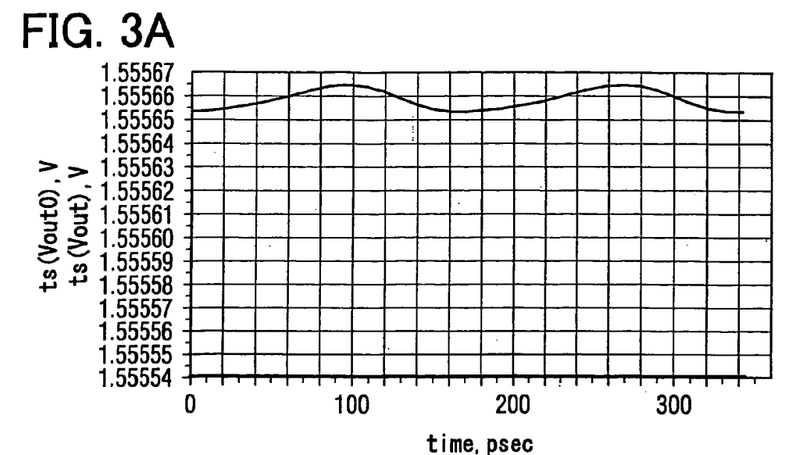
FIG. 3A is a graph showing operation simulation results of the start signal outputting circuit of the second embodiment.
Figure 3B:
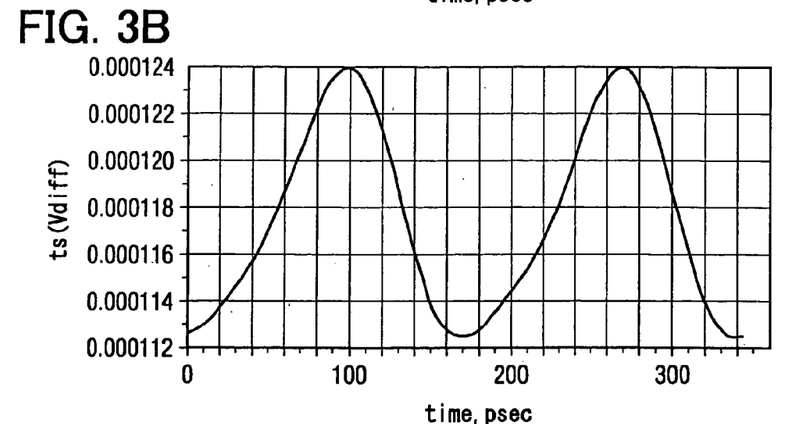
FIG. 3B is a graph showing a potential increase part arising from conversion of a high frequency power in the simulation.
Figure 3C:
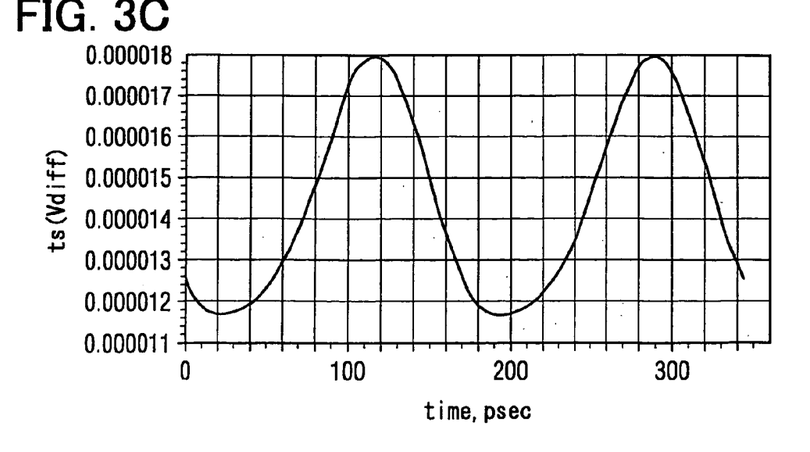
FIG. 3C is a graph showing operation simulation results of a start signal outputting circuit of FIG. 12 as a comparison example.
Figure 12:
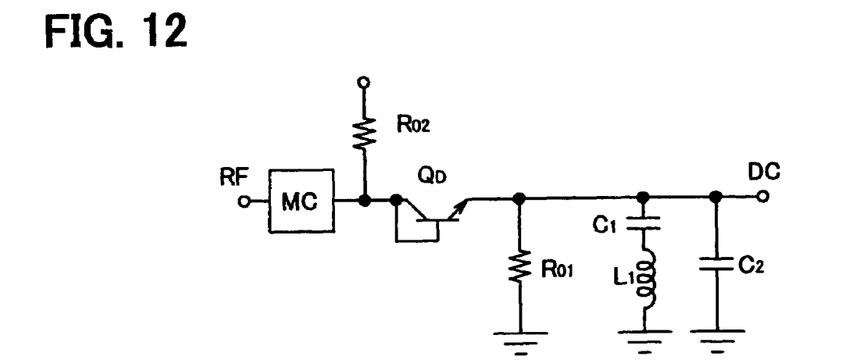
FIG. 12 is a circuit diagram of an RF/DC convertor circuit of a comparison example for comparison with the second embodiment.

A simulation of the operation of the RF/DC-conversion circuit 12 of FIG. 2 is shown in FIGS. 3A, 3B and 3C. $V_{out0}$ in FIG. 3A is the output potential of the RF/DC-conversion circuit 12 of FIG. 2 when a high frequency wave is not inputted, and is 1.55554V. $V_{out}$ in FIG. 3A is the output potential when a high frequency wave of 5.8 GHz, −50 dBm is inputted to the RF/DC-conversion circuit 12 of FIG. 2, and is 1.55566V. The difference between these is shown in FIG. 3B. From FIG. 3B it can be seen that a d.c. potential of 118 μV and a small a.c. potential component from the high frequency wave appear. The small a.c. potential component from the high frequency wave arises because the shorting effected by the capacitance $C_1$ and the inductance $L_1$ is incomplete. The d.c. potential of 118 μV is the result of the RF/DC-conversion circuit 12 of FIG. 2 converting the 5.8 GHz, −50 dBm high frequency wave into a d.c. potential. For comparison, a simulation of the operation of an RF/DC-conversion circuit of the kind shown in FIG. 12 simply having resistances $R_{O1}$ and $R_{O2}$ in place of the two biases provided by resistances and transistors in the RF/DC-conversion circuit 11 of FIG. 1 is shown in FIG. 3C. It can be seen that the RF/DC-conversion circuit of FIG. 12 only converts the 5.8 GHz, −50 dBm high frequency power to a small d.c. potential of 14 μV, whereas the RF/DC-conversion circuit 12 of FIG. 2 of the second embodiment of the present invention converts high frequency power into a d.c. potential efficiently.

When an amplifier or the like is not provided in a later stage, the RF/DC-conversion circuit 12 itself constitutes a start signal outputting circuit.

(Third Embodiment)

Figure 4:
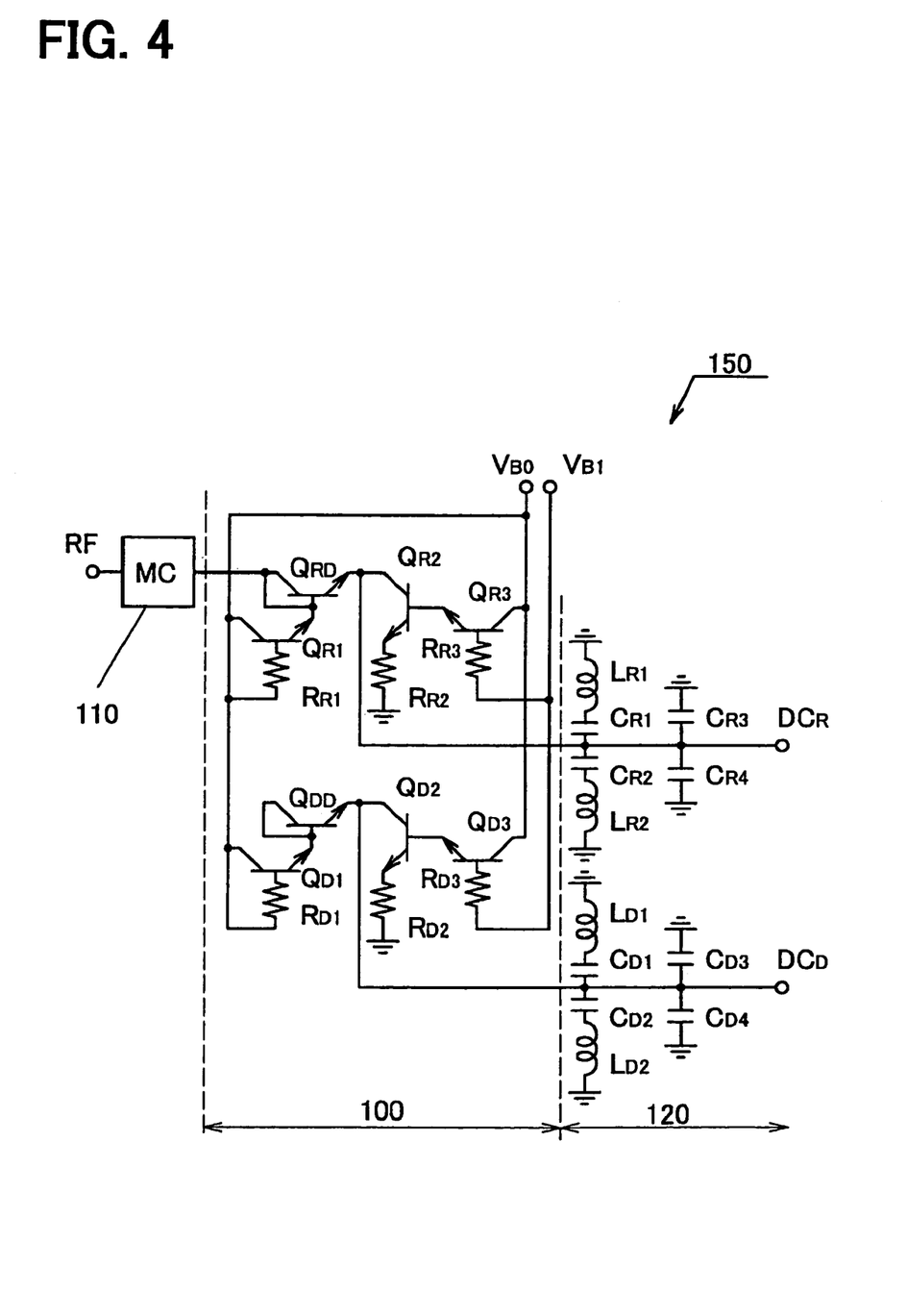
FIG. 4 is a circuit diagram showing an RF/DC convertor circuit constituting a main part of a start signal outputting circuit according to a third embodiment of the invention.

As a third embodiment of the invention, an RF/DC-conversion circuit 150 obtained by making the RF/DC-conversion circuit 12 of FIG. 2 a differential type is shown in FIG. 4. The RF/DC-conversion circuit 150 is made up of a matching circuit 110, a differential RF/DC convertor part 100, and a filter part 120. A high frequency signal is inputted to the differential RF/DC convertor part 100 through the matching circuit 110. The differential RF/DC convertor part 100 has substantially the same construction as the four transistors of the RF/DC-conversion circuit 12 of FIG. 2 in duplicate, and has two d.c. outputs. The filter part 120 performs low-pass filtering on each of the two d.c. outputs of the differential RF/DC convertor part 100. Of the differential RF/DC convertor part 100 of the RF/DC-conversion circuit 150 of FIG. 4, the construction which converts a high frequency wave to a d.c. potential is made up of npn transistors $Q_{RD}$, $Q_{R1}$, $Q_{R2}$, $Q_{R3}$ and resistances $R_{R1}$, $R_{R2}$, $R_{R3}$, which correspond to the npn transistors $Q_D$, $Q_1$, $Q_2$, $Q_3$ and the resistances R1, R'$_2$, R$_3$ of the RF/DC-conversion circuit 12 of FIG. 2 and are connected in substantially the same way. What is different is that whereas in the RF/DC-conversion circuit 12 of FIG. 2 three bias potentials $B_0$, $B_1$, and $B_3$ were used, in the differential RF/DC convertor part 100 of the RF/DC-conversion circuit 150 of FIG. 4 only two bias potentials $V_{B0}$ and $V_{B1}$ are needed. The bias potential $V_{B0}$ supplies a collector bias potential of the npn transistors $Q_{R1}$ and $Q_{R3}$ and via the resistance $R_{R1}$ a base bias potential to the npn transistor $Q_{R1}$. The bias potential $V_{B1}$ supplies a base bias potential of the npn transistor $Q_{R3}$ via the resistance $R_{R3}$. In this way, a high frequency wave is inputted to the anode side of the npn transistor $Q_{RD}$, and a d.c. potential is outputted from the cathode side.

The differential RF/DC convertor part 100 of the RF/DC-conversion circuit 150 of FIG. 4 has a construction which does not input the high frequency wave directly, and this construction is made-up of npn transistors $Q_{DD}$, $Q_{D1}$, $Q_{D2}$, $Q_{D3}$ and resistances $R_{D1}$, $R_{D2}$ and $R_{D3}$. To the anode side of the npn transistor $Q_{DD}$ on this high frequency non-converting side, only the bias $V_{B0}$ is applied via the resistance $R_{D1}$ and the npn transistor $Q_{D1}$. As a result, fluctuation of the bias potential is removed by the difference between the cathode side output of the npn transistor $Q_{RD}$ on the high frequency converting side and the cathode side output of the npn transistor $Q_{DD}$ on the high frequency non-converting side being taken, and only the d.c. potential derived from the conversion of the high frequency power is outputted.

In the filter part 120, with respect to the two outputs of the differential RF/DC convertor part 100, shorts with respect to the carrier frequency are formed using respective pairs of capacitances $C_{R1}$, $C_{R2}$, $C_{D1}$, $C_{D2}$ and pairs of inductances $L_{R1}$, $L_{R2}$, $L_{D1}$, $L_{D2}$. Also, the a.c. component is smoothed with respective pairs of smoothing capacitances $C_{R3}$, $C_{R4}$, $C_{D3}$, $C_{D4}$. When an amplifier or the like is not provided in a later stage, the RF/DC-conversion circuit 150 itself constitutes a start signal outputting circuit.

Figure 5A:
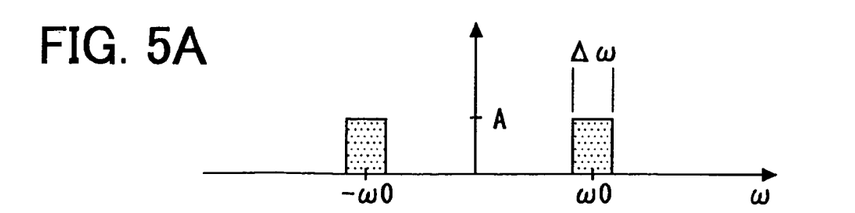
FIG. 5 is a view illustrating a filter operation of the invention.
Figure 5B:
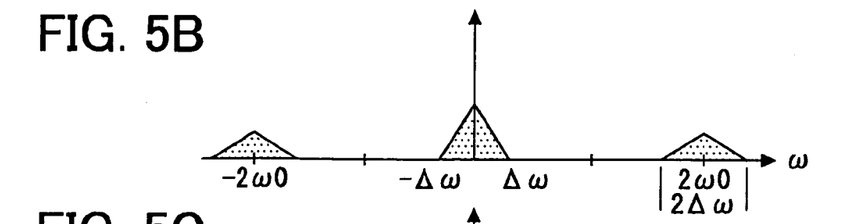
Figure 5C:
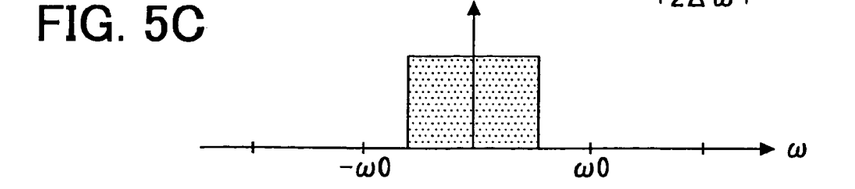
Figure 5D:
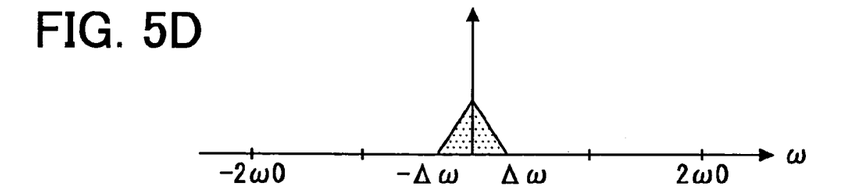
Figure 5E:
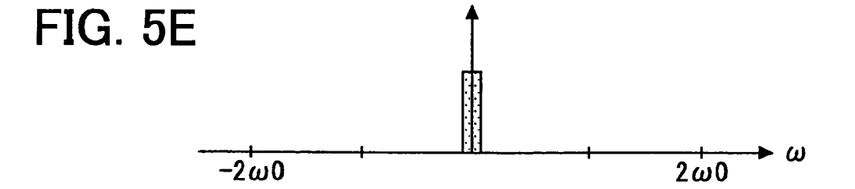

Next, characteristics of a filter part and an amplifier which constitute a second main part of the invention will be explained, using the spectrum charts of FIG. 5A through FIG. 5F. When a high frequency signal of center frequency $\omega_0$, band $\Delta\omega$ and amplitude A as shown in FIG. 5A is detected by double wave detection, it assumes the state shown in FIG. 5B. At this time, the noise is proportional to the three triangular areas. Of these, to take out the signal around the d.c. component (ω=0), with an ordinary detection circuit a low-pass filter having the kind of characteristic shown in FIG. 5C is used and the signal shown in FIG. 5D is obtained.

Figure 5F:
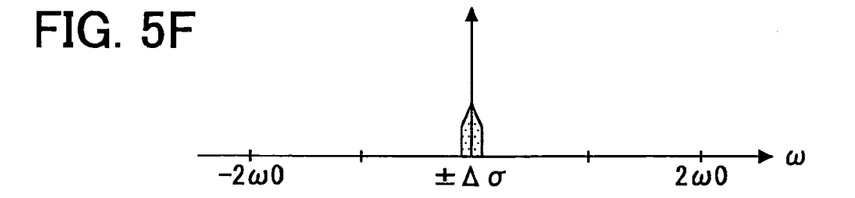

Now, in the present invention only a d.c. potential is needed, and the purpose is not the wave detection of a high frequency signal. So, a low-pass filter of the kind shown in FIG. 5E, which is extremely narrow with respect to the original band Δω, is used, and the signal shown in FIG. 5F is obtained. By this means noise also can be almost completely removed. For example, with respect to an original band Δω of 4.4 MHz, by filtering to only the low region of 2 kHz, it is possible to reduce noise to $\frac{1}{1100}$. This is an improvement of 30 dB.

And, according to T. Vlasits et al, 'A 5.8 GHz Microwave Link Automatic Debiting Applications', Microwave Journal, July 1995, in a construction for detecting an ASK signal directly by means of a diode, the reception power which will bring the bit error rate of the received signal to $10^{-6}$ can be expressed by means of the following Exp. 1.

$$P_{res} = 9.5 \frac{P_{TSS}}{2\sqrt{2}} \quad \text{(unit:} dBm\text{)} \quad (1)$$

And according to Hewlett Packard Application note 923, the following Exp. 2 holds.

$$P_{TSS} = -107 + 5\log B_V + 10\log I_d + \\ 5\log\left\{R_A + \frac{28}{I_d}\left(1 + \frac{f_N}{B_V}\ln\frac{B_V}{f_1}\right)\right\} + 10\log\left(1 + \frac{R_S C_J f^2}{I_d}\right) \quad \text{(unit:} dBm\text{)} \quad (2)$$

Here, $I_d$ is the diode current, and $R_A$, $R_S$, $C_j$ are parameters of when an equivalent circuit is substituted for the diode. If $I_d$=2 μA, $R_A$=0.909 kΩ, $R_S$=43.7Ω, $C_j$=0.4278 pF, $B_v$=4.4 MHz, and f=5.8 GHz, then $P_{TSS}$=−52.7 dBm and $P_{res}$=−47.4 dBm. Because as mentioned above in d.c. level detection an improvement of about 30 dB can be achieved, it can be seen that the sensing limit is −77 dBm.

Figure 6:
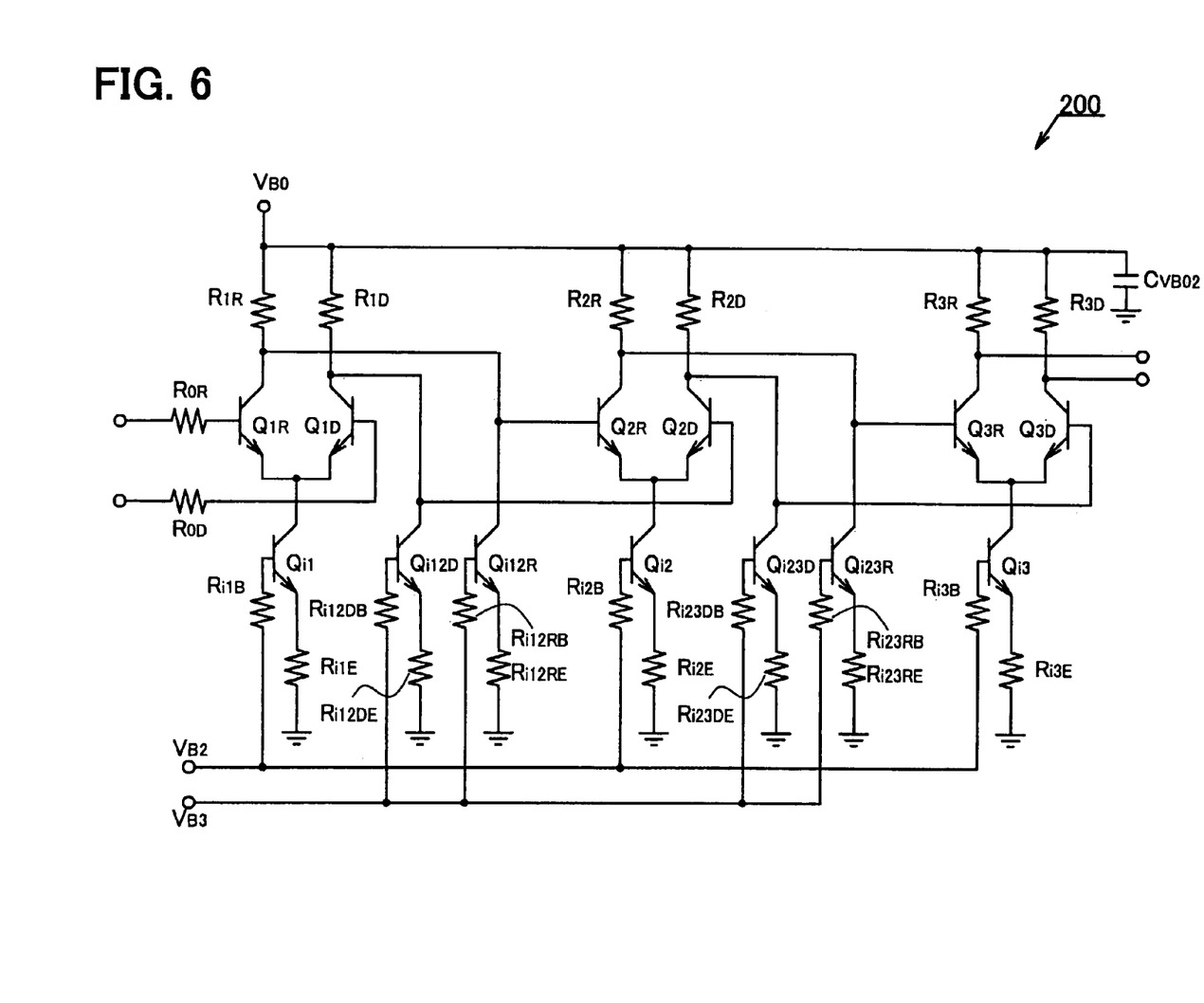
FIG. 6 is a circuit diagram showing the construction of a three-stage differential amplifier.

FIG. 6 is a circuit diagram showing the construction of an amplifier 200 having three operational amplifier stages. The construction of the operational amplifier of the n-th stage (n=1,2,3) is mainly made up of two npn transistors $Q_{nR}$, $Q_{nD}$, resistances $R_{nR}$, $R_{nD}$ connected to the collectors of the transistors $Q_{nR}$, $Q_{nD}$, and a constant current circuit connected to the emitters of the transistors $Q_{nR}$, $Q_{nD}$. A bias potential is supplied to the collectors of the two transistors $Q_{nR}$, $Q_{nD}$ from a constant voltage supply $V_{B0}$ via the resistances $R_{nR}$, $R_{nD}$, and the emitters of the two transistors $Q_{nR}$, $Q_{nD}$ are connected and grounded via the constant current circuit.

The constant current circuit is made up of an npn transistor $Q_{in}$ and two resistances $R_{inB}$, $R_{inE}$. The collector of the npn transistor $Q_{in}$ is connected to the emitters of the two transistors $Q_{nR}$, $Q_{nD}$. A bias potential $V_{B2}$ is supplied to the base of the transistor $Q_{in}$ via the resistance $R_{inB}$. The emitter of the transistor $Q_{in}$ is grounded via the resistance $R_{inE}$. The constant voltage supply $V_{B0}$ is grounded via a separate capacitance $C_{VB02}$.

A high frequency converting side input terminal is connected to the base of the npn transistor $Q_{1R}$ via a resistance $R_{OR}$. The collector of the npn transistor $Q_{1R}$ is connected to the base of the npn transistor $Q_{2R}$, the collector of the npn transistor $Q_{2R}$ is connected to the base of the npn transistor $Q_{3R}$, and the collector of the npn transistor $Q_{3R}$ is an output terminal. Similarly, a high frequency non-converting side input terminal is connected to the base of the npn transistor $Q_{1D}$ via a resistance $R_{OD}$; the collector of the npn transistor $Q_{1D}$ is connected to the base of the npn transistor $Q_{2D}$; the collector of the npn transistor $Q_{2D}$ is connected to the base of the npn transistor $Q_{3D}$; and the collector of the npn transistor $Q3_D$ is an output terminal.

Constant current circuits are also connected to the connections between the operational amplifiers of the different stages. That is, a constant current circuit made up of an npn transistor $Q_{i12R}$ and two resistances $R_{i12RB}$, $R_{i12RE}$ is connected to the collector of the npn transistor $Q_{1R}$ and the base of the npn transistor $Q_{2R}$. A bias potential $V_{B3}$ is applied to the base of the npn transistor $Q_{i12R}$.

The constant current circuit made up of the npn transistor $Q_{i12R}$ and the two resistances $R_{i12RB}$, $R_{i12RE}$ is constructed in the same way as the constant current circuit made up of the npn transistor $Q_{i1}$ and the two resistances $R_{i1B}$, $R_{i1E}$. Constant current circuits of the same construction, i.e. constant current circuits made up of an npn transistor $Q_{i23R}$ and two resistances $R_{i23RB}$, $R_{i23RE}$, an npn transistor $Q_{i12D}$ and two resistances $R_{i12DB}$, $R_{i12DE}$, and an npn transistor $Q_{i23D}$ and two resistances $R_{i23DB}$, $R_{i23DE}$, are connected to the other three connections between the operational amplifiers of the different stages.

Differential amplifiers like this have a low-pass filtering effect when operated at a low current. Accordingly, by using low-pass filters in combination or, as described above, connecting differential amplifiers in a plurality of stages, it is possible to transmit and amplify a band of below $\frac{1}{1000}$ compared to the band of the high frequency signal. That is, because with respect to the high frequency band only the band around d.c. is passed through low-pass filtering and amplified, sensitivity can be increased to much more than that of diode detection of related art.

(Fourth Embodiment)

Figure 7:
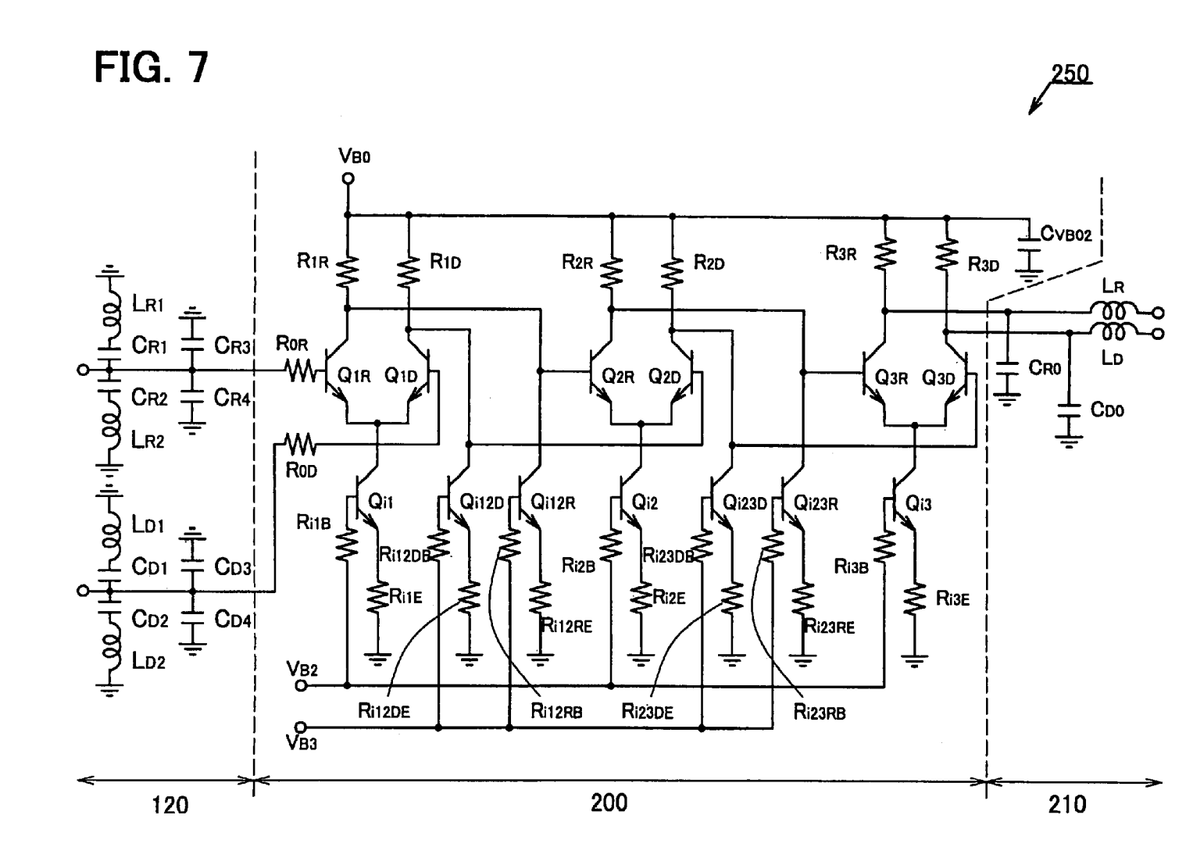
FIG. 7 is a circuit diagram showing a with-filter amplifier part constituting a main part of a start signal outputting circuit according to a fourth embodiment of the invention.

FIG. 7 is a circuit diagram showing the construction of a with-filter amplifier part 250 constituting a main part of a start signal outputting circuit according to a fourth embodiment of the invention. The with-filter amplifier part 250 constitutes a start signal outputting circuit together with an RF/DC-conversion circuit of a previous stage (not shown). The with-filter amplifier part 250 has a first-stage filter part 120, an amplifier 200, and a second-stage filter part 210. The construction of the first-stage filter part 120 of the with-filter amplifier part 250 of FIG. 7 is the same as the construction of the filter part 120 of the RF/DC-conversion circuit 150 of FIG. 4. And, the construction of the amplifier 200 of the with-filter amplifier part 250 of FIG. 7 is the same as the construction of the amplifier 200 of FIG. 6. The second-stage filter part 210 has with respect to the high frequency converting side output and the high frequency non-converting side output of the amplifier 200 filter circuits made up of inductances $L_R$ and $L_D$ and grounded capacitances $C_{R0}$ and $C_{D0}$. That is, the high frequency converting side output and the high frequency non-converting side output of the amplifier 200 are outputted from a high frequency converting side output terminal and a high frequency non-converting side output terminal through these filter circuits.

Figure 8A:
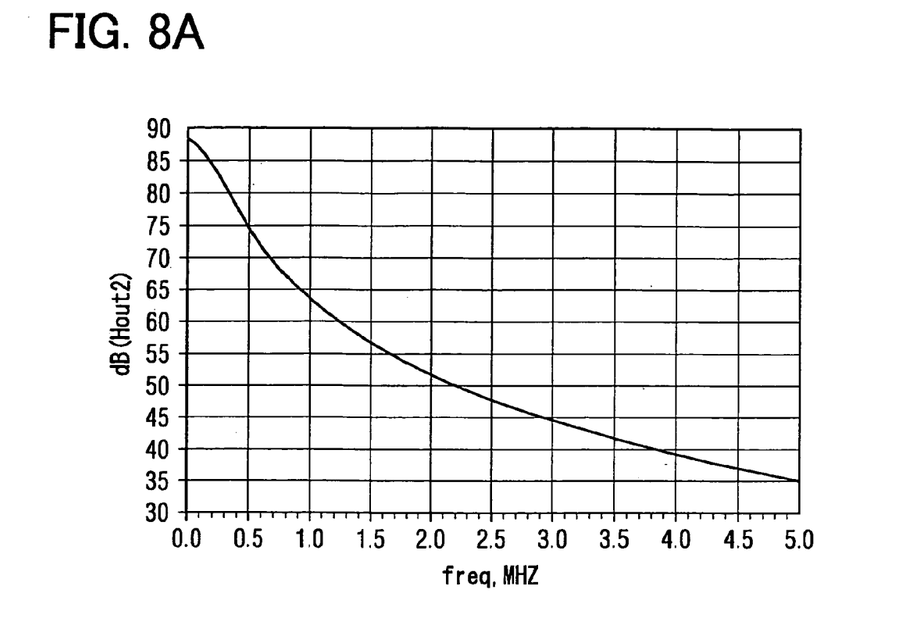
FIG. 8A is chart of the amplifying characteristic of the differential amplifier of FIG. 6 with respect to frequency.
Figure 8B:
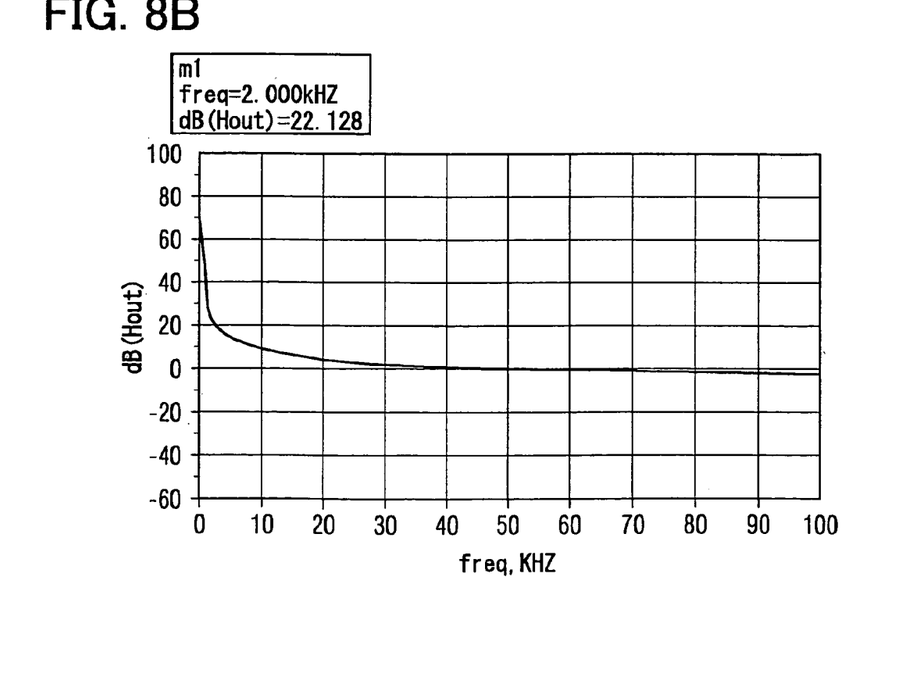
FIG. 8B is a chart of the amplifying characteristic of the with-filter amplifier part of FIG. 7 with respect to frequency.

The amplifying characteristic of the amplifier 200 of FIG. 6 is shown in FIG. 8A and the amplifying characteristic of the with-filter amplifier part 250 of FIG. 7 is shown in FIG. 8B. The amplifier 200, with no filter, of FIG. 6 shows a gain of 88 dB in the d.c. vicinity, and with increasing frequency the gain decreases monotonously to 35 dB at 5 MHz (FIG. 8A). This is a result of the differential amplifier having the effect of a low-pass filter. The with-filter amplifier part 250 of FIG. 7 has about the same gain in the d.c. vicinity as the amplifier 200 of FIG. 6 without a filter, but the gain at 2 kHz is greatly reduced to 22 dB and at 40 kHz and over it is no greater than 0 dB (FIG. 8B). This shows that in the with-filter amplifier part 250 of FIG. 7 the first-stage filter part 120 and the second-stage filter part 210 are fulfilling the role of an extremely narrow low-pass filter. To remove the unwanted high frequency component like this, it is desirable that the amplifying characteristic of the amplifier part decrease monotonously with frequency, and the steeper the slope of that decrease the more efficiently the high frequency component can be removed.

(Fifth Embodiment)

Figure 9:
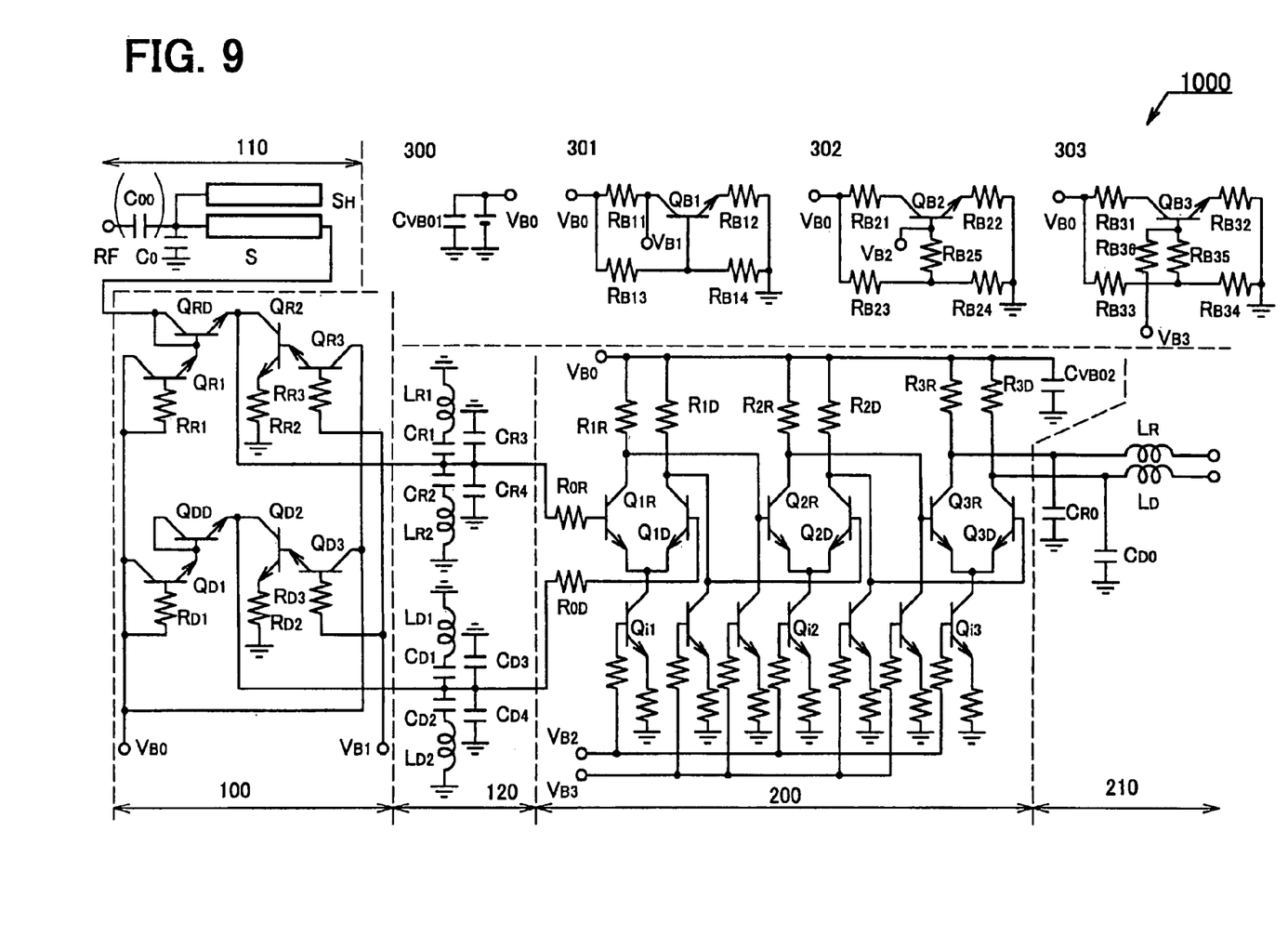
FIG. 9 is a circuit diagram showing a start signal outputting circuit according to a fifth embodiment of the invention.

FIG. 9 is a circuit diagram showing the construction of a start signal outputting circuit 1000 according to a fifth embodiment of the invention. The start signal outputting circuit 1000 is made up of a matching circuit 110, a differential RF/DC convertor part 100, a first-stage filter part 120, an amplifier 200, a second-stage filter part 210, a constant voltage source 300, and bias potential generating circuits 301, 302, and 303. The start signal outputting circuit 1000 of FIG. 9 consists of the construction of the with-filter amplifier part 250 apart from the first-stage filter part 120 added to the RF/DC-conversion circuit 150 of FIG. 4.

In FIG. 9, to avoid complexity, many of the reference numerals of the constituent devices of the seven constant current circuits of the amplifier 200 have been omitted. However, its construction is exactly the same as the amplifier 200 of FIG. 6 and FIG. 7, and the same reference numerals as those of the corresponding devices should of course be assigned. And, in FIG. 9, the wiring between the constant voltage source 300 and the supply destination of the potential $V_{B0}$ from the constant voltage source 300, and between the bias potential generating circuits 301, 302, and 303 and the supply destinations of their bias potentials $V_{B1}$, $V_{B2}$, $V_{B3}$ is not shown.

The matching circuit 110 is made up of a capacitance $C_{00}$ for removing an inputted d.c. component (this may be outside the matching circuit, i.e. as a previous stage), an open half stub $S_H$, a grounded capacitance $C_0$ and a stub S. The differential RF/DC convertor part 100 is the same construction as the differential RF/DC convertor part 100 of FIG. 4 and is supplied with the potential $V_{B0}$ from the constant voltage source 300 and the bias potential $V_{B1}$ from the bias potential generating circuit 301. The constructions of the first-stage filter part 120, the amplifier 200 and the second-stage filter part 210 are exactly the same as in FIG. 7, and the amplifier 200 is supplied with the potential $V_{B0}$ from the constant voltage source 300 and the bias potentials $V_{B2}$, $V_{B3}$ from the bias potential generating circuits 302, 303.

The bias potential generating circuit 301 is constructed using an npn transistor $Q_{B1}$. A resistance $R_{B11}$ is connected to the collector of the transistor $Q_{B1}$, a resistance $R_{B12}$ to the emitter, and resistances $R_{B11}$, $R_{B14}$ to the base. The other ends of the resistance $R_{B12}$ and the resistance $R_{B14}$ are grounded, and the potential $V_{B0}$ from the constant voltage source 300 is supplied to the other ends of the resistances $R_{B11}$ and $R_{B13}$. The bias potential $V_{B1}$ is made the collector potential of the transistor $Q_{B1}$.

The bias potential generating circuit 302 is constructed using an npn transistor $Q_{B2}$. A resistance $R_{B21}$ is connected to the collector of the transistor $Q_{B2}$ and a resistance $R_{B22}$ to the emitter. One end of a resistance $R_{B25}$ is connected to the base of the npn transistor $Q_{B2}$, and resistances $R_{B23}$, $R_{B24}$ are connected to the other end of the resistance $R_{B25}$. The other ends of the resistances $R_{B22}$, $R_{B24}$ are grounded, and the potential $V_{B0}$ from the constant voltage source 300 is supplied to the other ends of the resistances $R_{B21}$ and $R_{B23}$. The bias voltage $V_{B2}$ is made the base potential of the transistor $Q_{B2}$.

The bias potential generating circuit 303 is constructed using an npn transistor $Q_{B3}$. A resistance $R_{B31}$ is connected to the collector of the transistor $Q_{B3}$, a resistance $R_{B32}$ to the emitter and a resistance $R_{B35}$ and a resistance $R_{B36}$ to the base. Resistances $R_{B33}$ and $R_{B34}$ are each connected to the other end of the resistance $R_{B35}$. The other ends of the resistances $R_{B32}$ and $R_{B34}$ are grounded, and the potential $V_{B0}$ from the constant voltage source 300 is supplied to the other ends of the resistances $R_{B31}$ and $R_{B33}$. The bias potential $V_{B3}$ is made the potential of the other end of the resistance $R_{B36}$ connected to the base of the transistor $Q_{B3}$.

Figure 10A:
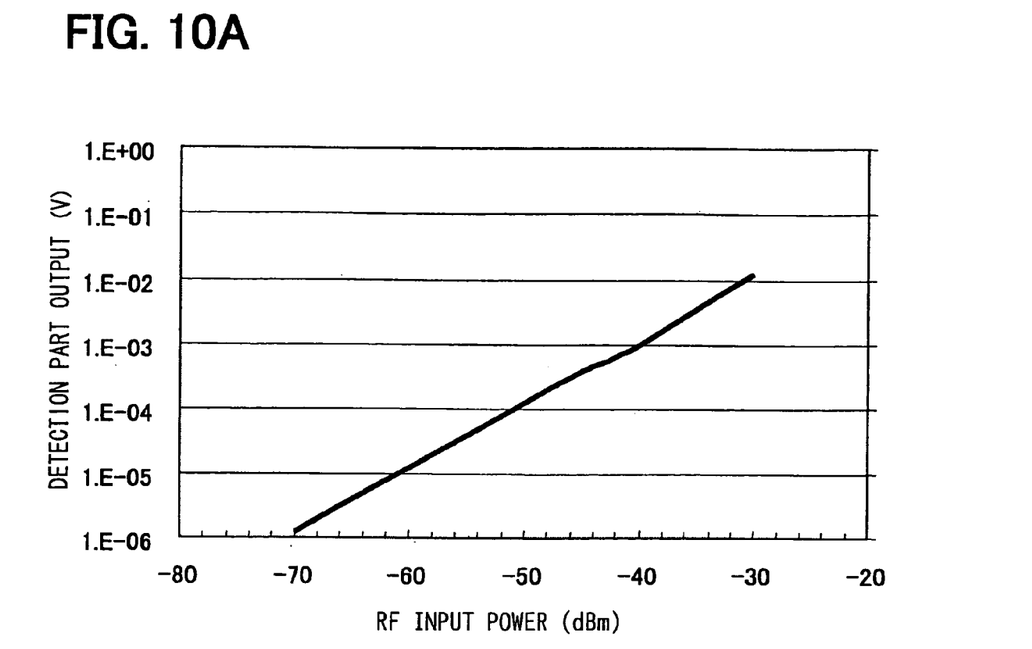
Figure 10B:
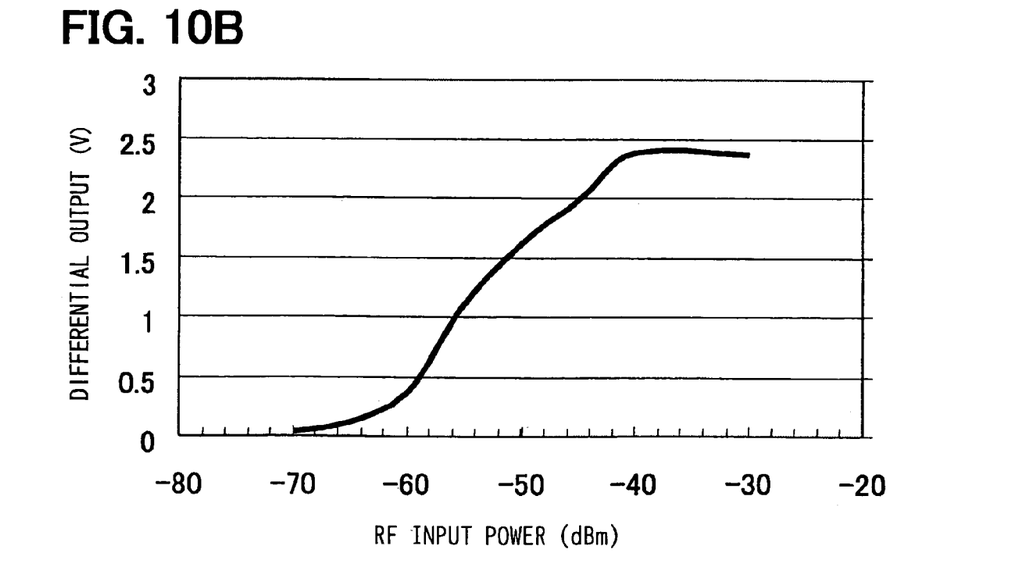

FIGS. 10A and 10B are characteristic charts showing characteristics of the start signal outputting circuit 1000 of FIG. 9. Of these, FIG. 10A is the differential output of the first-stage filter part 120 (the difference between the potential of the two terminals) when an inputted high frequency power is varied, and FIG. 10B is the differential output of the second-stage filter part 210 (the difference between the potential of the two terminals) when an inputted high frequency power is varied. As shown in FIG. 10A, even when the inputted high frequency power is weak, at −70 dBm, with the differential RF/DC convertor part 100 a conversion output (d.c. potential) of about 1 µV can be obtained. When the inputted high frequency power is −60 dBm, a conversion output of about 10 µV is obtained with the differential RF/DC convertor part 100, and after three-stage amplification a d.c. output of 0.3V can be obtained. When the high frequency power is −40 dBm or above, a conversion output (d.c. potential) of 10 mV or above is obtained with the differential RF/DC convertor part 100, and after three-stage amplification a d.c. output of 2.4V can be obtained.

Thus, with this invention, it is possible to construct a start signal outputting circuit for outputting a start signal for starting a communication device when it receives a designated high frequency wave. Any of the circuits set forth in the above embodiments can be integrated extremely easily, and because only a current of 2 to 3 µA flows, the power consumed in high frequency wave 'standby time' is also extremely low. And, when an amplifier is used, because the current flowing through this amplifier is also extremely small, the threshold frequency of the low-pass filter action is lowered, the low-pass filtering is more sure, and low power consumption can also be achieved.

INDUSTRIAL APPLICABILITY

The start signal outputting circuit of this invention generates a d.c. potential by converting a high frequency signal and uses this d.c. potential as a starting signal of a designated device. Accordingly, the start signal outputting circuit of this invention is suitable for use in receivers for receiving command signals wirelessly. Therefore, fields of application of the invention include for example ITS, LAN and monitoring systems including ETC. For example in the field of ITS, it is possible to realize an electronic number plate which communicates a vehicle number only when a gate is to be passed through, and at other times does not perform such communication. And for example in a monitoring system, it is possible to realize an ID card which transmits an ID only when a user is entering or leaving a room. In this way, by using a start signal outputting circuit according to the invention, it is possible to cause a primary battery of a communication device to be consumed only when necessary, whereby the invention is extremely useful and has an extremely wide range of applications.

What is claimed is:

1. A start signal outputting circuit having an RF/DC convertor circuit for converting a high frequency power (RF) signal into a direct current (DC) potential and outputting it, said RF/DC convertor circuit comprising:
   a device working as a diode for rectifying the high frequency power (RF) signal inputted on its anode;
   a first transistor connected to an anode side of said diode, said first transistor working as a constant current source for supplying a constant current to the anode side of said diode by a positive potential being applied thereto; and
   a second transistor inserted between a cathode side of said diode and ground, said second transistor working as a constant current source for removing a constant current from a current outputted from the cathode side of said diode by a positive potential being applied thereto.

2. A start signal outputting circuit recited in claim 1, wherein said RF/DC convertor circuit further comprises a resonance circuit connected between said cathode side of said diode and ground for shorting with the high frequency power of a specified frequency.

3. A start signal outputting circuit recited in claim 1, wherein said RF/DC convertor circuit further comprises a matching circuit provided on said anode side of said diode for obtaining matching with respect to an inputted high frequency power.

4. A start signal outputting circuit recited in claim 1, further comprising a counterpart circuit of the same construction as said RF/DC convertor circuit, of which an anode of a device working as a diode is provided with a d.c. potential based on the positive potential given to said RF/DC convertor circuit, so that a differential RF/DC convertor part is formed by said RF/DC convertor circuit and said counterpart circuit.

5. A start signal outputting circuit recited in claim 4, further comprising:
   a differential amplification part for carrying out a differential amplification of at least one stage for an output of said differential RF/DC convertor part; and
   a low-pass filter disposed at least one of between said differential RF/DC convertor part and said differential amplification part and a later stage of said differential amplification part,
   wherein outputs of said differential amplification part and low-pass filter transmit a band of below 1/1000 compared to a band of said high frequency power signal.

6. A start signal outputting circuit recited in claim 5, wherein a transfer function of a part composed of said low-pass filter and said differential amplification part has a characteristic of monotonous decrease with frequency of a high frequency signal.

7. A start signal outputting circuit having an RF/DC convertor circuit for converting a high frequency power (RF) into a direct current potential (DC) and outputting it, said RF/DC convertor circuit comprising:
   a device working as a diode;
   a first npn transistor having its emitter connected to an anode side of said diode and its base and collector to which a predetermined positive potential is applied;
   a second npn transistor having its collector connected to a cathode side of said diode and its emitter connected to ground via a resistance;
   a third npn transistor having its emitter connected to a base of said second npn transistor and its base and collector to which a predetermined positive voltage is applied; and
   a resonance circuit connected between said cathode side of said diode and ground for shorting a specified frequency.

8. A start signal outputting circuit recited in claim 7, wherein said RF/DC convertor circuit further comprises a matching circuit provided on said anode side of said diode for obtaining matching with respect to an inputted high frequency power.

9. A start signal outputting circuit recited in claim 8, further comprising:
   a differential amplification part for carrying out a differential amplification of at least one stage for an output of said differential RF/DC convertor part; and
   a low-pass filter disposed at least one of between said differential RF/DC convertor part and said differential amplification part and a later stage of said differential amplification part,
   wherein outputs of said differential amplification part and low-pass filter transmit a band of below 1/1000 compared to a band of said high frequency power signal.

10. A start signal outputting circuit recited in claim 8, wherein a transfer function of a part composed of said low-pass filter and said differential amplification part has a characteristic of monotonous decrease with frequency of a high frequency signal.

11. A start signal outputting circuit recited in claim 7, further comprising a counterpart circuit of the same construction as said RF/DC convertor circuit, of which an anode of a device working as a diode is provided with a d.c. potential based on the positive potential given to said RF/DC convertor circuit, so that a differential RF/DC convertor part is formed by said RF/DC convertor circuit and said counterpart circuit.

12. A start signal outputting circuit recited in claim 11, further comprising:
   a differential amplification part for carrying out a differential amplification of at least one stage for an output of said differential RF/DC convertor part; and
   a low-pass filter disposed at least one of between said differential RF/DC convertor part and said differential amplification part and a later stage of said differential amplification part,
   wherein outputs of said differential amplification part and low-pass filter transmit a band of below 1/1000 compared to a band of said high frequency power signal.

13. A start signal outputting circuit recited in claim 11, wherein a transfer function of a part composed of said low-pass filter and said differential amplification part has a characteristic of monotonous decrease with frequency of a high frequency signal.

* * * * *